United States Patent [19]

Taskar et al.

[11] Patent Number: 5,293,074
[45] Date of Patent: Mar. 8, 1994

[54] OHMIC CONTACT TO P-TYPE ZNSE

[75] Inventors: Nikhil R. Taskar; Babar A. Khan, both of Ossining; Donald R. Dorman, Carmel, all of N.Y.

[73] Assignee: North American Philips Corporation, New York, N.Y.

[21] Appl. No.: 878,657

[22] Filed: May 5, 1992

[51] Int. Cl.$^5$ .................. H01L 23/48; H01L 29/46; H01L 29/62
[52] U.S. Cl. .................. 257/744; 257/78; 257/609; 257/614; 257/746
[58] Field of Search .................. 257/42, 76, 78, 607, 257/609, 613, 614, 744, 746

[56] References Cited

U.S. PATENT DOCUMENTS

| | | | |
|---|---|---|---|
| 4,123,295 | 10/1978 | McCaldin et al. | 257/741 |
| 4,456,670 | 6/1984 | Basol | 257/745 |
| 5,150,191 | 9/1992 | Motegi et al. | 257/78 |

Primary Examiner—Ngan Ngo
Attorney, Agent, or Firm—Norman N. Spain

[57] ABSTRACT

A semiconductor structure with a p-type ZnSe layer has an improved ohmic contact consisting of a layer of $Hg_xZn_{1-x}Te_aSe_bSc$ where $x=0-1$ with x being 0 at the surface of the ZnSe layer and increasing thereafter, a, b and c each $=0-1$ and $a+b+c=1$.

11 Claims, 9 Drawing Sheets

OHMIC CONTACT TO P-TYPE ZNSE

BACKGROUND OF THE INVENTION

It is well known that it is very difficult to form an ohmic contact to a p-type zinc selenide layer. This is particularly so, even for a heavily doped P-type zinc selenide, especially if the dopant is nitrogen.

The cause of this problem is probably due to the relatively high Schottky barriers of the various metals used to make the contact, these barriers being about 1 eV.

There have been many attempts to solve this problem. Thus, Uemoto J. Appl. No. 62-297359 teaches forming an ohmic contact by growing a p-type amorphous Si layer by a photo-assisted CVD method on the p-type ZnSe layer and then depositing Mo and Al on the Si layer. However, since there is no grading of the p-type amorphous layer, a barrier of only a few tenths of a volt may result in the prevention of the formation of an ohmic contact. Additionally, since there is no continuity of the lattice of the ZnSe layer into the deposited amorphous Si layer, the amorphous layer probably can be easily peeled away from the ZnSe layer thus resulting in poor mechanical integrity of the Si-pZnSe contact.

Okawa J. Appl. No. 62 16921 teaches the formation of an ohmic contact by the evaporation of a gold layer directly on the surface of a p-type ZnSe layer to which nitrogen ion acceptors have been added.

The contact achieved is not an ohmic contact. It has been found, however that the contact formed is not an ohmic contact but is a Schottky contact with a barrier of about 1.4 eV. Such a contact requires the application of about 15 V or larger to achieve current density in the order of 10 A/cm$^2$.

Basol U.S. Pat. No. 4,456,630 teaches a method of forming ohmic contacts on IIB-UIA p-type doped layers by etching the surface of the layers with an acidic solution to form a surface that is non-metal rich, treating the etched surface with a basic solution and then depositing a conductive metal layer. The only example shown of the p-type material is p-type cadmium telluride. Moreover, the method shown here does not work for p-ZnSe.

McCaldin et al U.S. Pat. No. 4,123,295 teaches, in general, that an improved contact may be made on a p-type semiconductor body such as a p-type zinc selenide by forming a layer of a mercury cholcogenide such as MgSe, MgS or HgTe on its surface.

However, in the example shown in this patent, an ohmic contact is made on an n-type zinc selenide body doped with aluminum by wetting the surface of the body with an amalgam of HgInCd and heating to 450° for 1 minute.

In any event there is no suggestion in this patent of forming a ohmic contact on a p-type ZnSe semiconductor body in which the dopant is N. Heating at a temperature of 450° C. as shown in the example of the patent would not be useful as it would destabilize the N-dopants present and would tend to decrease the effective concentrations of the N dopants.

The McCaldin et al patent also shows cleaving of the resultant sample and the formation of an epitaxial layer of stoichiometric HgSe by evaporation on the sample of Hg and Se. The patent indicates that a ohmic contact is not found because it states that "All measurement showed a barrier significantly higher than the Au barrier on the same substrate", col. 2, lines 63–65.

Kamata J. Appl. No. 63-10826 shows the formation of an ohmic contact on a p-doped ZnSSe layer by providing an intermediate layer of p-type GaAs between the metal contact layer and the ZnSSe layer. However, it has been found that here too an ohmic contact is not found since the barrier between the p-type ZnSe and p-type GaAs is about 1 eV.

SUMMARY OF THE INVENTION

It is a principal object of this invention to provide a semiconductor structure in which there is present a p-type, nitrogen doped, ZnSe layer provided with an improved ohmic contact.

This and other objects of the invention will be apparent from the description that follows.

According to one aspect of the invention a semiconductor structure comprising a p-type, nitrogen doped, ZnSe layer is provided with an improved ohmic contact to the ZnSe layer by forming, on the surface of the ZnSe layer, a mercury zinc sulfoselenide, telluride, sulfotelluride sulfide or selenide or a mercury zinc salt of a mixture of selenium and tellurium in which sulfur may be present and in which the concentration of mercury increases from zero at the surface of the ZnSe layer. The formula of this ohmic contact is $Hg_xAn_{1-x}Te_aSe_bS_c$ wherein $x = 0-1$ and is 0 at the surface of the ZnSe layer and increases thereafter, $a = 0-1$, $b = 0-1$, $c = 0-1$ and $a+b+c = 1$.

According to a further aspect of the invention the formula of this ohmic contact is $Hg_xZn_{1-x}Se_bS_c$ wherein $x = 0-1$, $b = 0-1$, $c = 0-1$, $b+c = 1$ and x is 0 at the surface of the ZnSSe layer and increases thereafter to a value not greater than 1.

According to an additional aspect of the invention the ohmic type contacts of the invention are provided on p-doped ZnSe layers by immersing these layers in a mercury bath, heated to a temperature in excess of 200° C., but not greater than 350° C. for a period of time greater than 120 minutes.

DETAILED DESCRIPTION OF THE INVENTION

According to a preferred aspect of the invention the value of x at the outer surface of the ohmic type contact is 1. Thus, according to this aspect of the invention there is no zinc but mercury present at the outer surface of the ohmic type contact.

According to a still further preferred aspect of the invention a outer surface of the ohmic type contact is in contact with the conductive metallic layer. Examples of metals that may be used for such metallic layers are gold, silver, aluminum, tungsten and other metals used for the formation of conductive layers in the semiconductive art.

Preferably the ohmic type contact is a layer of $Hg_xZn_{1-x}Se$ wherein x varies from 0 at the ZnSe layer to 1 at its outer surface, in the formula $Hg_xZn_{1-x}Te_aSeSc$, a=c=0.

The ohmic type contact may be doped or undoped, if the ohmic contact is doped it preferably p doped. An example of a p dopant that may be employed is lithium.

The ohmic type contact is provided on the ZnSe layer preferably by immersing this layer in a bath of mercury heated to 200° to 350° C. for a period of 2-24 hours. If doping is desired, Li may be added to the Hg bath.

Doping may also be achieved by heating the ohmic type contact to form Hg vacancies.

The conductive metallic layer may be provided by evaporation from a suitable metal upon removal of the ZnSe layer from the Hg bath.

If the ohmic type contact contains tellurium or sulfur the ohmic type contact may be formed by metal organic vapor phase epitaxy or molecular beam epitaxy.

The thickness of the layer forming the ohmic contact of the invention is about 100 Å to 3000 Å and preferably is about 1000 Å to 3000 Å (depending on the doping level in the p-type layer and the graded layer.)

Example 1

Figure 1:
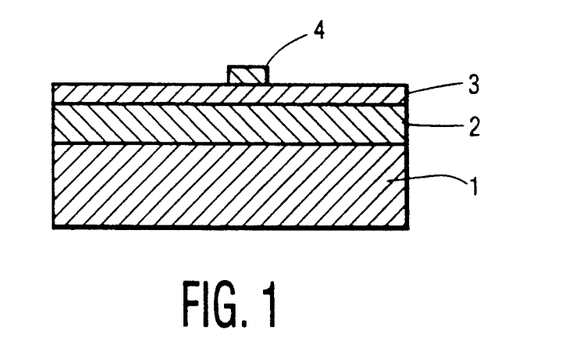
FIG. 1 is a cross-sectional view of a portion of a semiconductor structure comprising a heavily doped p-type zinc selenide layer provided with an ohmic contact of the invention.

Referring to FIG. 1, a semiconductor gallium arsenide substrate 1 was provided with a p-type ZnSe layer 2 of a thickness of 1-2 μm. The p-type ZnSe layer 2 was then immersed in a Hg bath heated to a temperature of 200°-350° C. for a period of 2-24 hours.

As a result there was formed a thin layer 3 of a thickness of 100-200 Å $Hg_xZn_{1-x}Se$ in which x=0-1 with x being 0 at the interface with the p-type ZnSe layer and 1 at its outer surface. An Au contact 4 of a thickness of about 1000 Å was then provided on the $Hg_xZn_{1-x}Se$ layer by evaporation.

Example II

The procedure as described in Example 1 was carried out with the addition in that an amount of Li to provide a Li doped concentration of $10^{16}$–$10^{17}$ cm$^{-3}$ in the resultant $Hg_xZn_{1-x}Se$ layer was added to the Hg bath in the form of solid Li.

IV plots measured on structures prepared according to these examples are shown in FIGS. 3-9. The information regarding the formation of the $Hg_xZn_{1-x}Se$ layer and the metal contact is given in under each plot.

Figure 3:
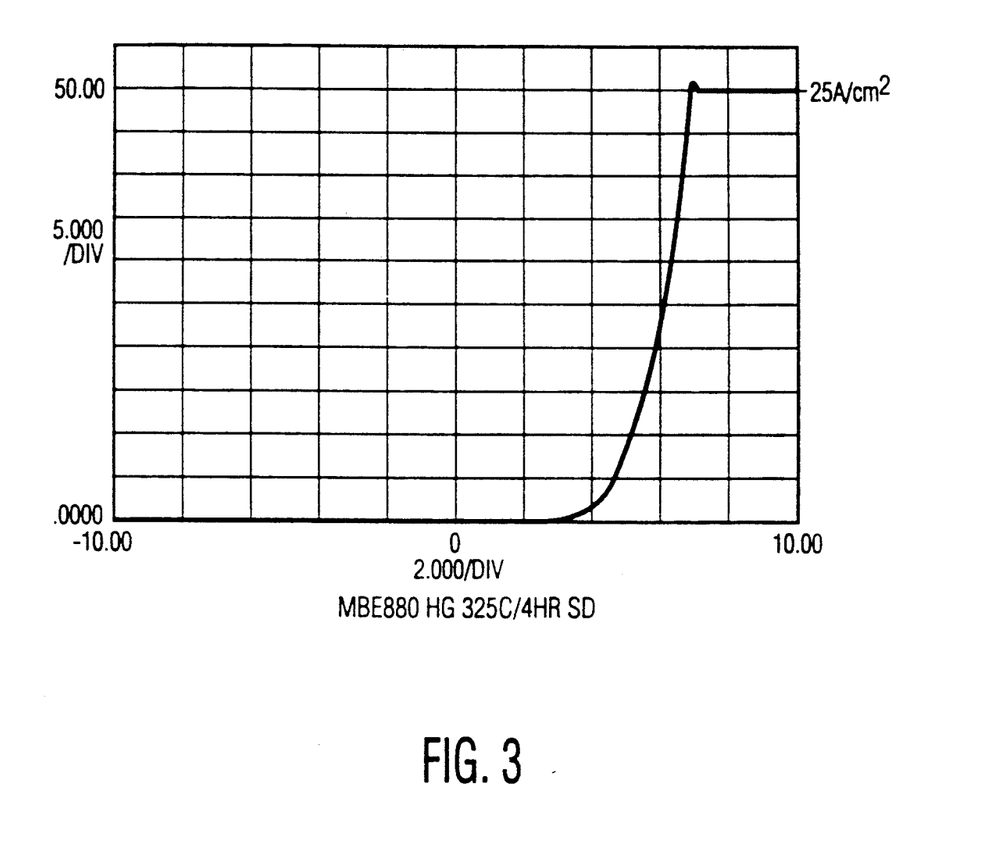
FIGS. 3–9 are I–V plots of a p-type zinc selenide layer provided with the ohmic type contacts of the invention.

Thus in FIG. 3 "MBE 880" identifies the layer, "Hg" indicates that the layer was undoped (i.e. without Li), "325C/4HR" indicates that the alloying was carried out at a temperature of 325° C. for a period of 4 hours and "SD" indicates the size of the contact area of the gold contact. In the plot in FIG. 3 this is indicated to be $2\times10^{-3}$ cm$^2$.

Figure 4:
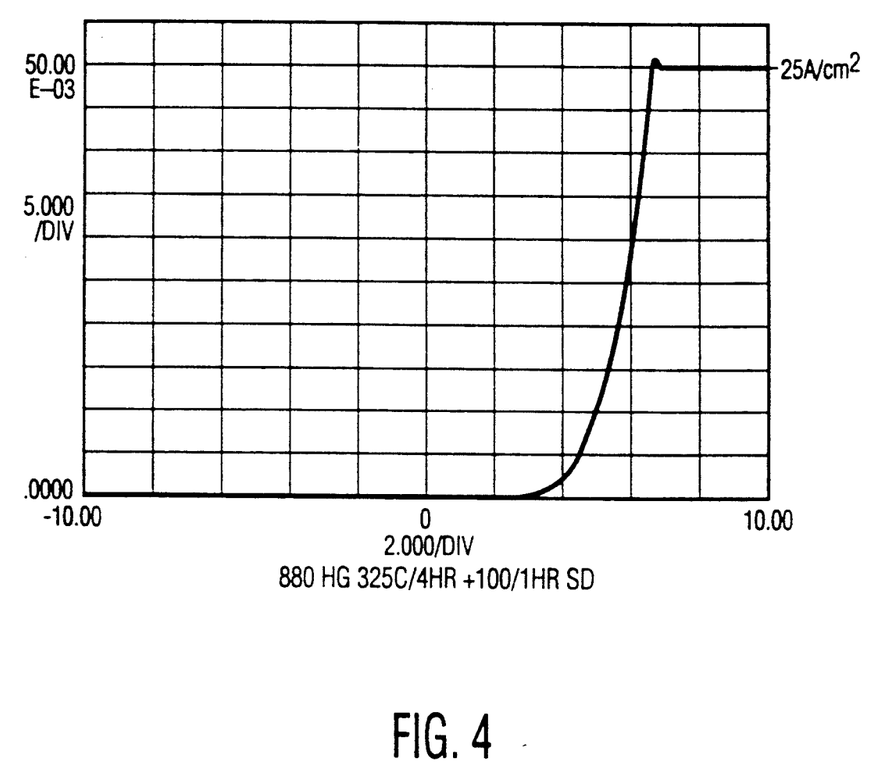

In FIG. 4 "+100C/1 hr" indicates that the layer was heated at a temperature of 100° C. for a period of 1 hour after the alloying (following removal from Hg bath) to form Hg vacancies.

Figure 5:
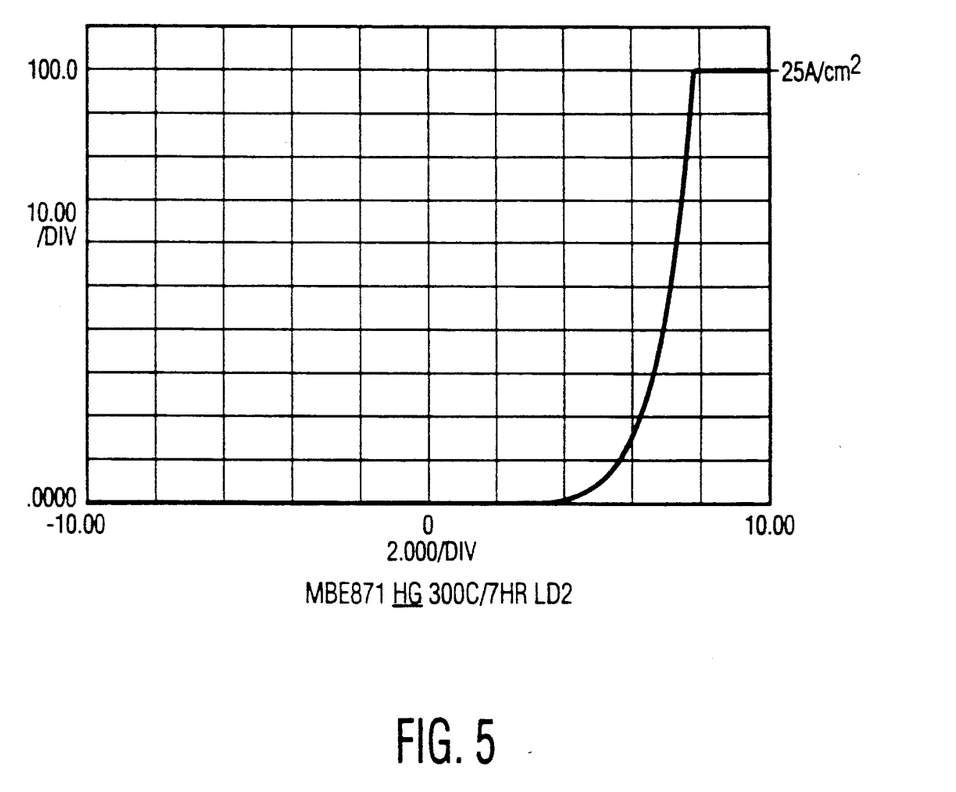

In FIG. 5 "MBE871" identifies the layer, "300 C/7HR" indicates that the alloying was carried out at a temperature of 300° C. for a period of 7 hours and "LD" indicates the size of the contact area of the gold contact. In the plot in FIG. 5 this is indicated to be $4\times10^{-3}$ cm$^2$.

Figure 6:
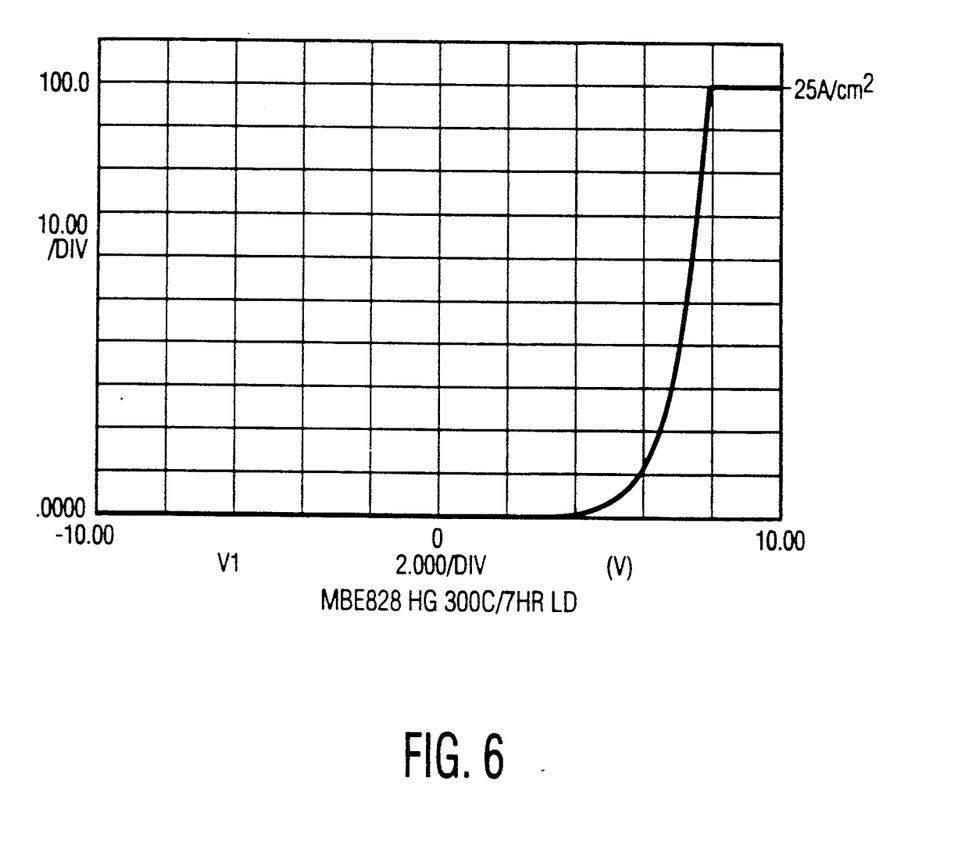

In FIG. 6 "MBE 828" identifies the layer.

Figure 7:
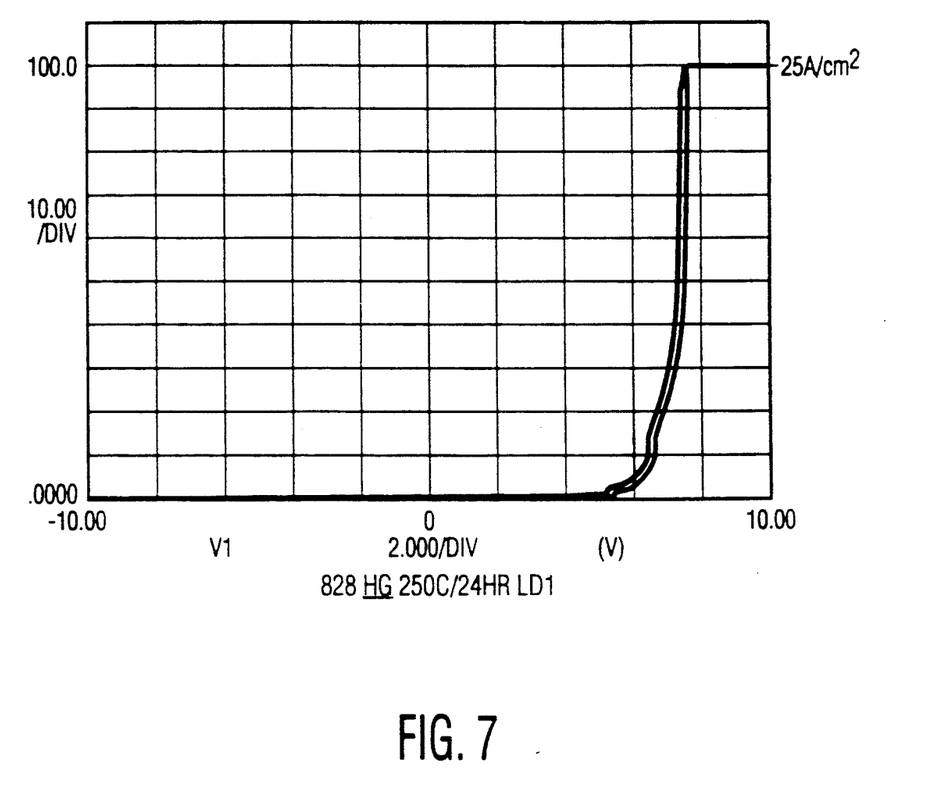

In FIG. 7 "250C/24HR" indicates that the alloying was carried out at a temperature of 250° C. for a period of 24 hours.

Figure 8:
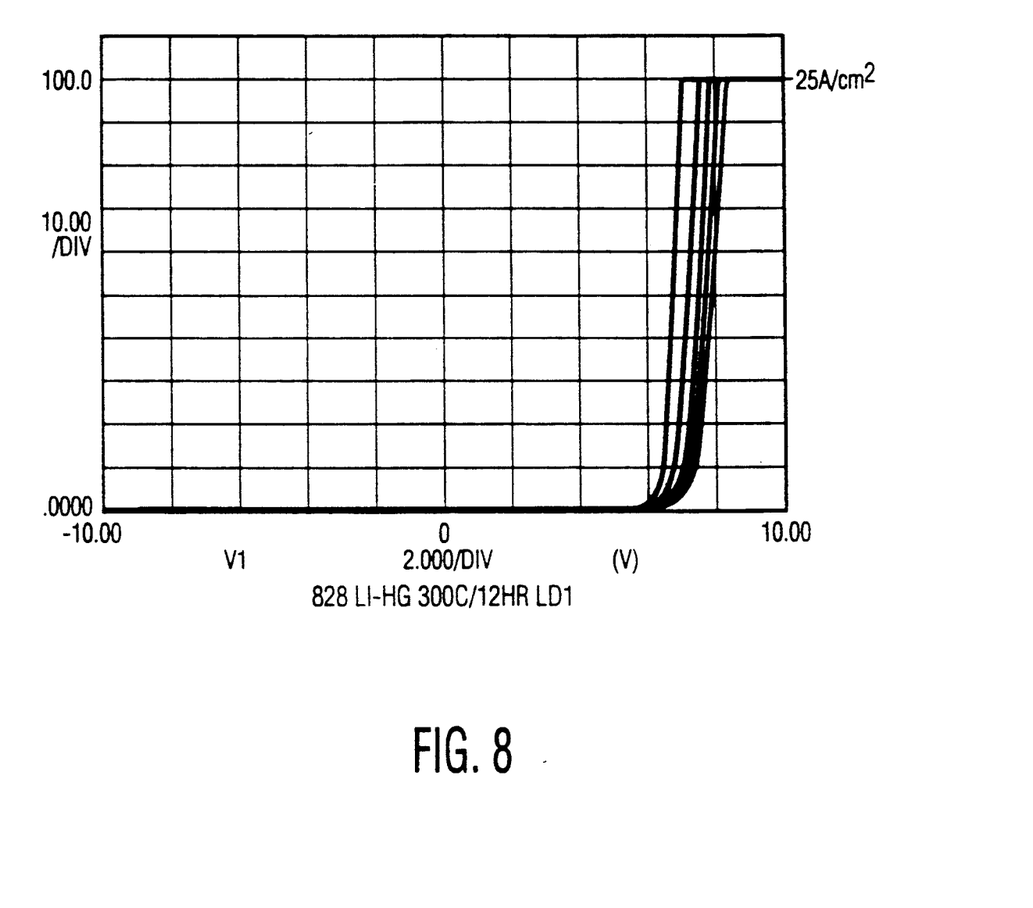

In FIG. 8 "Li-Hg" indicates that the Hg bath was doped with Li to a concentration of $10^{17}$ and "300° C./12 HR" indicates that alloying was carried out at a temperature of 300° C. for a period of 12 hours.

Figure 9:
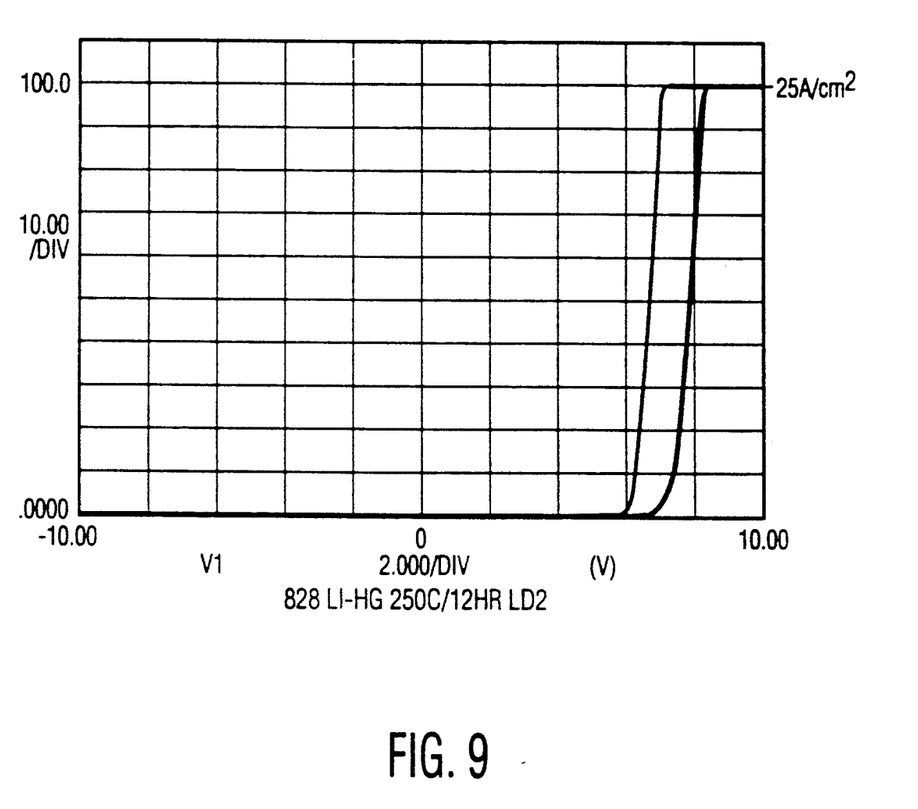

In FIG. 9 "250C/12HR" indicates that the alloying was carried out at 250° C. for a period of 12 hours.

In all these examples, the p-type ZnSe layers were nitrogen doped with a doping level of $\sim 10^{17}$.

Also shown in the plots is the current level corresponding to a current density of 25 A/cm$^2$. The current levels are 100 mA and 50 mA for "LD" and "SD", respectively. The thickness of the MBE828, MBE880 SnSe layers were 1 μm and the MBE871 ZnSe layers were 2 μm.

The plots shown are produced by a vertical application of voltage.

Figure 2:
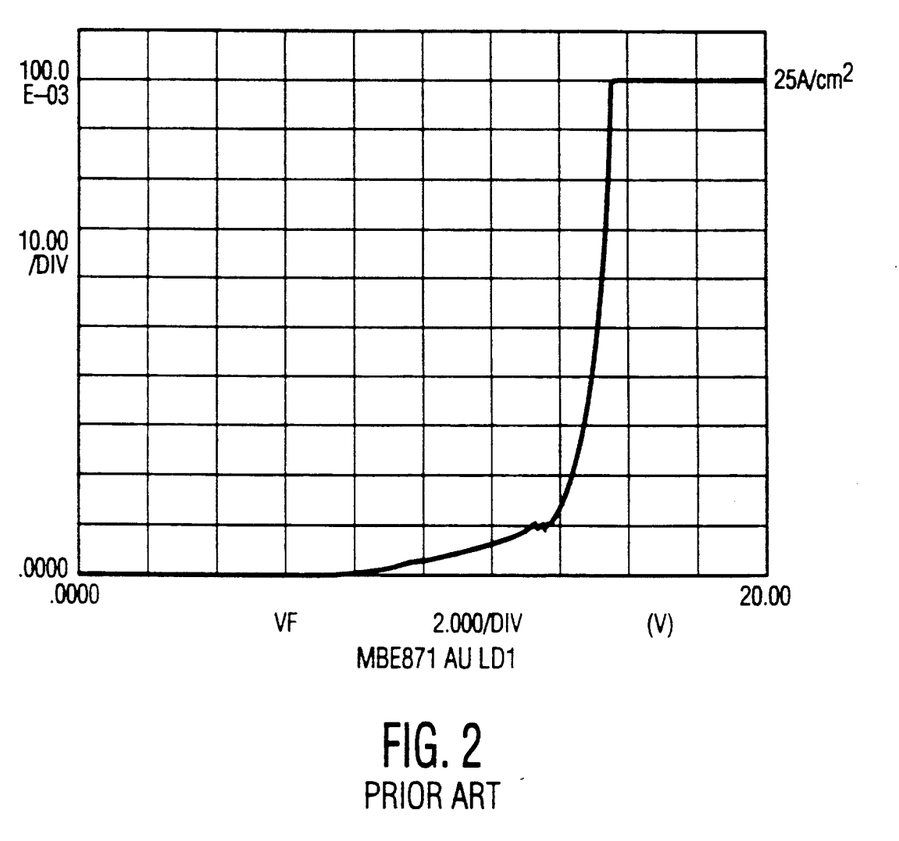
FIG. 2 is an I–V plot of a p-type zinc selenide layer directly provided with a gold contact.

The plot shown in FIG. 2 was carried out in the same manner except that the Au contact was evaporated directly on the ZnSe layer.

As shown in the plots of FIGS. 3-9 a voltage level of 6.5-8V is required to obtain a current density level of the order of 25 A/cm$^2$ when the method of the invention is employed. However when the method of the invention is not employed, a voltage level of about 16 V is required to obtain a current density level also of 25 A/cm$^2$ as shown in FIG. 2.

Thus the method of the invention clearly results in a significantly superior ohmic contact to the p-type ZnSe layer.

We claim:

1. A semiconductor structure comprising a p-type ZnSe layer doped with nitrogen and provided with an improved ohmic contact, said ohmic contact consisting of a layer of $Hg_xZn_{1-x}Te_aSe_bS_c$, wherein x has a value of 0–1, the value of x being 0 at the surface of said ZnSe layer and increasing thereafter and a, b and c, each have a value of 0–1 and a+b+c=1.

2. The ohmic contact of claim 1 wherein the value of x increases to 1.

3. The semiconductor structure of claim 1 wherein the value of a=c=0.

4. The semiconductor structure of claim 2 wherein the value of a=c=0.

5. The semiconductor structure of claim 1 wherein the surface of the $Hg_xZn_{1-x}Te_aSe_bS_c$ layer contacts a conductive metallic layer.

6. The semiconductor structure of claim 3 wherein the surface of $Hg_xZn_{1-x}Te_aSe_bS_c$ layer contacts a conductive metallic layer.

7. The semiconductor structure of claim 3 wherein the $Hg_xZn_{1-x}Te_aSe_bS_c$ layer is p-doped.

8. The semiconductor structure of claim 7 wherein the $Hg_xZn_{1-x}Te_aSe_bS_c$ layer is p-doped with Li.

9. The semiconductor structure of claim 4 wherein the $Hg_xZn_{1-x}Te_aSe_bS_c$ layer is p-doped.

10. The semiconductor structure of claim 9 wherein the $Hg_xZn_{1-x}Te_aSe_bS_c$ layer is p-doped with Li.

11. A semiconductor structure comprising a nitrogen doped, p-type ZnSe or ZnSSe layer provided with an improved ohmic contact, said ohmic contact consisting of a layer of $Hg_xZn_{1-x}Se_bS_c$ wherein x has a value of 0–1, b and c each have a value of 0–1, b+c=1 and the value of x is 0 at the surface of the ZnSSe or ZnSe layer and increasing to 1 at the surface of the $Hg_xZn_{1-x}S_bSe_c$ layer

* * * * *